(12) United States Patent
Takagi

(10) Patent No.: US 6,667,529 B2
(45) Date of Patent: Dec. 23, 2003

(54) SEMICONDUCTOR DEVICE

(75) Inventor: Kazuhisa Takagi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/984,825

(22) Filed: Oct. 31, 2001

(65) Prior Publication Data
US 2002/0163002 A1 Nov. 7, 2002

(30) Foreign Application Priority Data

May 7, 2001 (JP) ......................................... 2001-136113

(51) Int. Cl.[7] ........................... H01L 23/58; H01L 33/00
(52) U.S. Cl. ........................... 257/488; 257/99; 257/94; 257/96; 257/97
(58) Field of Search ...................... 372/50, 26; 257/12, 257/13, 743, 80, 94, 96, 97, 99, 488; 359/248

(56) References Cited

U.S. PATENT DOCUMENTS

| | | | | |
|---|---|---|---|---|
| 5,459,747 A | * | 10/1995 | Takiguchi et al. | 372/102 |
| 5,481,559 A | * | 1/1996 | Kawamura | 372/50 |
| 5,657,339 A | * | 8/1997 | Fukunaga | 372/45 |
| 5,821,568 A | * | 10/1998 | Morita et al. | 257/94 |
| 6,054,724 A | * | 4/2000 | Ogihara et al. | 257/88 |

FOREIGN PATENT DOCUMENTS

JP          7-221400          8/1995

* cited by examiner

Primary Examiner—Steven Loke
Assistant Examiner—Samuel A Gebremariam
(74) Attorney, Agent, or Firm—Leydig, Voit & Mayer, Ltd.

(57) ABSTRACT

A semiconductor device has a first semiconductor layer, a second semiconductor layer, and an active layer sandwiched between the first and the second semiconductor layer and emits light from the active layer when a voltage is applied across the first and the second semiconductor layer. The semiconductor device includes an anode on the first semiconductor layer, an insulating film on the anode, and a screen electrode on the insulating film covering at least part of the anode. The second semiconductor layer is grounded and the screen electrode is electrically connected to the grounded second semiconductor layer. The screen electrode screens the anode to prevent flow of a leakage current between the first and second semiconductor layers due to electromagnetic waves.

8 Claims, 7 Drawing Sheets

SEMICONDUCTOR DEVICE

BACKGROUND OF THE INVENTION

1. Field of the Invention

The present invention relates to a semiconductor device and a method of manufacturing the same and, more particularly, to a light modulator-semiconductor laser device, and a semiconductor laser.

2. Background Art

Recently, a light modulator-semiconductor laser device formed by combining a light modulator and a semiconductor laser has been practically applied to an optical communication system.

FIG. 9 is a perspective view of a conventional light modulator-semiconductor laser device. As shown in FIG. 9, the light modulator-semiconductor laser device includes a semiconductor laser unit 30 and a light modulator unit 31.

FIG. 10 is a sectional view of the semiconductor laser unit 30 taken along a line perpendicular to an optical axis 32 in FIG. 9. Referring to FIG. 10, the semiconductor laser unit 30 includes an n-InP substrate 1, a cathode 2 of Ti/Au, an anode 3 of Ti/Au, an insulating film 5 of silicon dioxide ($SiO_2$) or silicon nitride (SiN), an n-InP clad layer 6, and an InGaAsP multiple quantum well active layer 7. The light modulator unit 31 is provided with an InGaAsP multiple quantum well absorbing layer at a position corresponding to the InGaAsP multiple quantum well active layer 7, and an anode 4 at a position corresponding to the anode 3.

Shown also in FIG. 10 are a p-InP first clad layer 8, a p-InGaAsP diffraction grating 9, a p-InP second clad layer 10, a p-InP first buried layer 11, an n-InP second buried layer 12, a p-InP third buried layer 13, a p-InP third clad layer 14, and a p-InGaAsP contact layer 15.

The operation of the conventional light modulator-semiconductor laser device will be described. When a forward current flows through the anode 3 and the cathode 2 of the semiconductor laser unit 30, stimulated emission of light occurs in the InGaAsP multiple quantum well active layer 7 and laser oscillation of a frequency dependent on the grating constant of the p-InGaAsP diffraction grating 9 occurs. The p-InP first buried layer 11, the n-InP second buried layer 12 and the p-InP third buried layer 13 have a current constricting function to inject a current efficiently into the InGaAsP multiple quantum well active layer 7.

When a voltage is applied across the anode 4 and the cathode 2 of the light modulator unit 31 to reverse-bias the pn-junction and a high-frequency signal is superposed on the voltage, the quantum-confined Stark effect of the quantum well and the Franz-Keldysh effect of the semiconductor change a light absorption spectrum. When a light beam of a wavelength emitted by the semiconductor laser unit 30 falls on the light modulator unit 31, the intensity of the light beam is modulated by the high-frequency signal.

The light modulator-semiconductor laser device is capable of producing an intensity-modulated optical signal and is used as a light source for an optical transmitter.

The light modulator-semiconductor laser device modulates the light beam emitted by the semiconductor laser unit 30 in the light modulator unit 31. Therefore, the light modulator unit 31 must be contiguous with the semiconductor laser unit 30. Electromagnetic waves generated by the light modulator unit 31 when a high-frequency voltage is applied to the light modulator unit 31 for modulation propagate through space and part of the electromagnetic waves enter the semiconductor laser unit 30.

Carrier density in the InGaAsP multiple quantum well active layer 7 varies with time when a high-frequency current is supplied to the semiconductor laser unit 30 and, consequently, the refractive index of the InGaAsP multiple quantum well active layer 7 varies. Thus, the wavelength of the light beam incident on the light modulator unit 31 is modulated and the width of the spectrum of the modulated light increases unnecessarily. Consequently, the transmission distance of an optical fiber having a large chromatic dispersion is reduced, causing the deterioration of the characteristic of the optical transmitter.

SUMMARY OF THE INVENTION

The present invention has been made to solve the foregoing problems and it is therefore an object of the present invention to provide a semiconductor device capable of preventing the leakage of a high-frequency current into a semiconductor laser when a high-frequency voltage is applied to a light modulator and of enabling high-speed optical transmission, and a method of manufacturing such a semiconductor device.

According to one aspect of the present invention, there is provided a semiconductor device having an active layer, a first semiconductor layer formed on one side of the active layer and a second semiconductor layer formed on the other side of the active layer, and capable of emitting light when a voltage is applied across the first and the second semiconductor layer. The semiconductor device comprises a first electrode formed on the first semiconductor layer, to which a predetermined voltage is applied, and a second electrode formed on an insulating film so as to cover at least part of the first electrode. And the second electrode is grounded.

According to another aspect of the present invention, there is provided a method of manufacturing a semiconductor device having an active layer, a first semiconductor layer formed on one side of the active layer and a second semiconductor layer formed on the other side of the active layer, and capable of emitting light when a voltage is applied across the first and the second semiconductor layer. The method comprises the following steps. Firstly the first semiconductor layer is formed on a semiconductor substrate. Secondly the active layer is formed on the first semiconductor layer. Thirdly the second semiconductor layer is formed on the active layer. Fourthly a laminated film consisting of the second semiconductor layer, the active layer and the first semiconductor layer is selectively etched in a ridge such that openings reaching the semiconductor substrate are formed on the opposite sides of the ridge. Fifthly a first conductive film is formed on the second semiconductor layer. Sixthly an insulating film is formed on the first conductive film. Seventhly a second conductive film is formed on the insulating film so as to cover the first conductive film and is connected through the openings to the semiconductor substrate.

According to the present invention, since the second electrode is formed on the insulating film covering the first electrode and the second electrode is grounded, the first electrode to which a predetermined voltage is applied can be screened and hence, even if electromagnetic waves propagate through space, the flow of leakage current between both the semiconductor layers due to the effect of the electromagnetic waves can be prevented.

Other and further objects, features and advantages of the invention will appear more fully from the following description.

DETAILED DESCRIPTION OF THE PREFERRED EMBODIMENTS

First Embodiment

Figure 1:
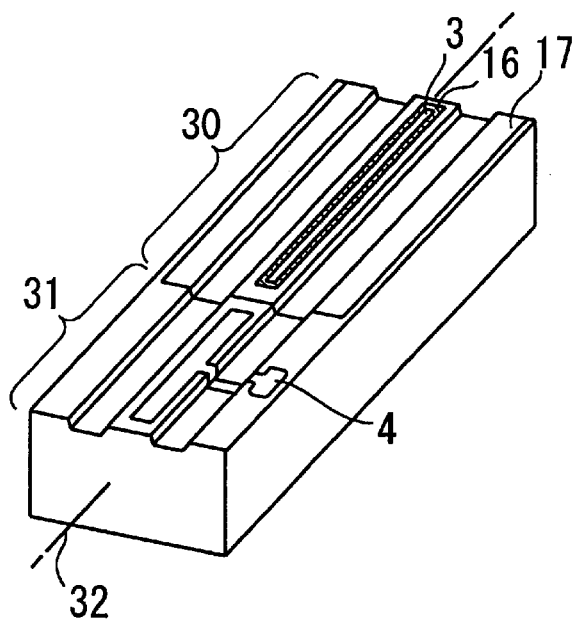
FIG. 1 is a perspective view of a light modulator-semiconductor laser device in a first embodiment according to the present invention.

Referring to FIG. 1 showing a perspective view of a light modulator-semiconductor laser device in a first embodiment according to the present invention, the light modulator-semiconductor laser device includes a semiconductor laser unit 30 that emits a laser beam and a light modulator unit 31 that modulates the intensity of the laser beam emitted by the semiconductor laser unit 30.

Figure 2:
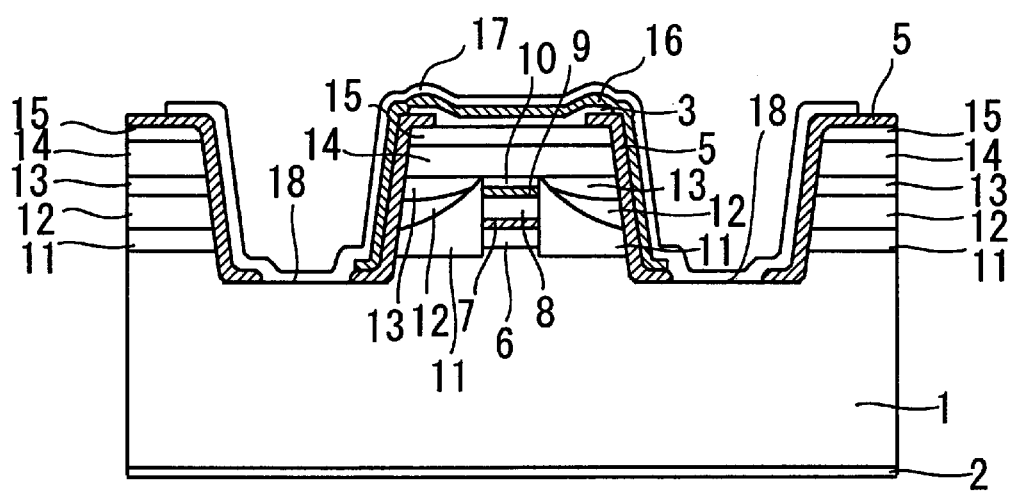
FIG. 2 is a typical sectional view of a semiconductor laser unit included in the light modulator-semiconductor laser device shown in FIG. 1.

FIG. 2 is a sectional view taken on a line perpendicular to an optical axis 32 shown in FIG. 1. FIG. 2 is a sectional view of a part of FIG. 1 in which an anode 3 and an insulating film 16 are not exposed. Shown in FIG. 2 are an n-InP substrate 1, i.e., a starting material, a Ti/Au cathode 2, a Ti/Au anode 3 of the semiconductor laser unit 30, an insulating film 5 of silicon dioxide ($SiO_2$) or silicon nitride (SiN), an n-InP clad layer 6, and an InGaAsP multiple quantum well active layer 7. In the light modulator unit 31, an InGaAsP multiple well absorbing layer 7' is formed at a position corresponding to the InGaAsP multiple quantum well active layer 7, and an anode 4 is formed at a position corresponding to the anode 3.

Shown also in FIG. 2 are a p-InP first clad layer 8, a p-InGaAsP diffraction grating layer 9, a p-InP second clad layer 10, a p-InP first buried layer 11, an n-InP second buried layer 12, a p-InP third buried layer 13, a p-InP third clad layer 14 and a p-InGaAsP contact layer 15. The anode 3 is formed on and electrically connected to the p-InGaAsP contact layer 15. FIG. 2 further shows the insulating film 16 of silicon dioxide ($SiO_2$) or silicon nitride (SiN) and a screen electrode 17 of Ti/Au. The screen electrode 17 is connected through a contact hole 18 formed in the insulating film 16 to the n-InP substrate 1, i.e., an n-type semiconductor layer.

In this light modulator-semiconductor laser device in the first embodiment, the n-InP clad layer 6, i.e., an n-type semiconductor layer, is formed under the InGaAsP multiple quantum well active layer 7, and the p-InP first clad layer 8, i.e., a p-type semiconductor layer, the p-InGaAsP diffraction grating layer 9, the p-InP second clad layer 10, the p-InP third clad layer 14 and the p-InGaAsP contact layer 15 are formed on the InGaAsP multiple quantum well active layer 7. When a forward voltage is applied across the anode 3 and the cathode 2, i.e., across the n-type and p-type semiconductor layers, the n-type semiconductor layer injects electrons into the InGaAsP multiple quantum well active layer 7, and the p-type semiconductor layer injects holes into the InGaAsP multiple quantum well active layer 7.

In this light modulator-semiconductor laser device in the first embodiment, the screen electrode 17 for intercepting electromagnetic waves is formed on the insulating film 16 covering the anode 3 of the semiconductor laser unit 30, and the screen electrode 17 is connected to the n-InP substrate 1.

The operation of the light modulator-semiconductor laser device in the first embodiment will be described. When a forward current is supplied so as to flow from the anode 3 to the cathode 2 of the semiconductor laser unit 30, stimulated emission of light occurs in the InGaAsP multiple quantum well active layer 7 and laser oscillation of a frequency dependent on the grating constant of the p-InGaAsP diffraction grating 9 occurs. The p-InP first buried layer 11, the n-InP second buried layer 12 and the p-InP third buried layer 13 have a current constricting function to inject a current efficiently into the InGaAsP multiple quantum well active layer 7.

In the light modulator unit 31, a voltage is applied across the anode 4 and the cathode 2 so that a pn-junction is reverse biased and a high-frequency signal is superposed on voltage. Consequently, the quantum-confined Stark effect of the quantum well and the Franz-Keldysh effect of the semiconductor change a light absorption spectrum. When a light beam of a wavelength emitted by the semiconductor laser unit 30 falls on the light modulator unit 31, the intensity of the light beam is modulated by the high-frequency signal.

Thus the light modulator-semiconductor laser device is capable of producing an intensity-modulated optical signal and is suitable for use as a light source for an optical transmitter. It is preferable to use the light modulator-semiconductor laser device at a modulation rate in the range of 2.5 to 40 Gb/s.

In this light modulator-semiconductor laser device in the first embodiment, the screen electrode 17 for intercepting electromagnetic waves is formed on the insulating film 16 covering the anode 3 of the semiconductor laser unit 30. The screen electrode 17 of the same potential as that of the grounded n-InP substrate 1 screens the anode 3 from the electromagnetic waves generated by the high-frequency voltage applied to the light modulator 31 and propagated through space. Consequently, any high-frequency leakage current does not flow between the anode 3 and the cathode 2 when the high-frequency voltage is applied to the light modulator 31.

Thus the screen electrode 17 prevents the variation of carrier density in the InGaAsP multiple quantum well active layer 7 with time attributable to the leakage current and the resultant variation of the refractive index of the InGaAsP multiple quantum well active layer 7 and, consequently, the wavelength of the light incident on the light modulator 31 can be stabilized. Therefore, the deterioration of transmission quality of an optical fiber having a large chromatic dispersion can be limited to the least extent.

A description will be given of a method of manufacturing the light modulator-semiconductor laser device in the first embodiment with reference to FIGS. 3, 4 and 5, which are typical sectional views in a plane including the optical axis 32 showing a workpiece in the steps of a method of manufacturing the light modulator-semiconductor laser device in the first embodiment.

Figure 3A:
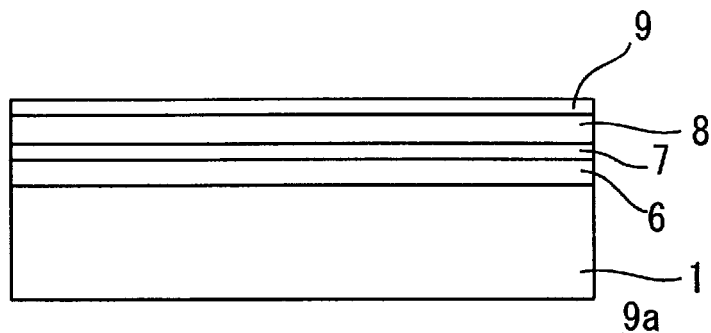
FIGS. 3A, 3B, 3C and 3D are typical sectional views of assistance in explaining the steps of a method of manufacturing the light modulator-semiconductor laser device shown in FIG. 1.

As shown in FIG. 3A, the n-InP clad layer 6, the InGaAsP multiple quantum well active layer 7, the p-InP first clad layer 8 and the p-InGaAsP diffraction grating layer 9 are deposited sequentially on the n-InP substrate 1, i.e., a starting material, by organometallic compound chemical vapor deposition processes (MOCVD processes).

Figure 3B:
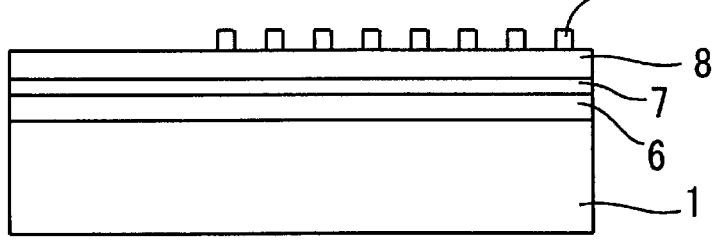

Then, as shown in FIG. 3B, the p-InGaAsP diffraction grating layer 9 is patterned and etched by an etching process using an interference exposure method to form a diffraction grating 9a.

Figure 3C:
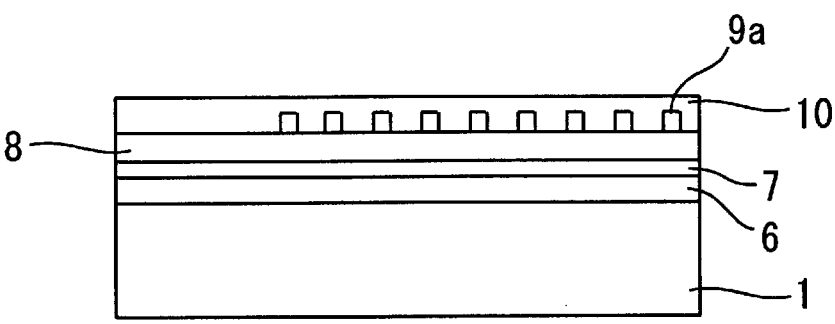

Then, as shown in FIG. 3C, the p-InP second clad layer 10 is formed by a MOCVD process or the like such that the diffraction grating 9a is buried in the p-InP second clad layer 10.

Figure 3D:
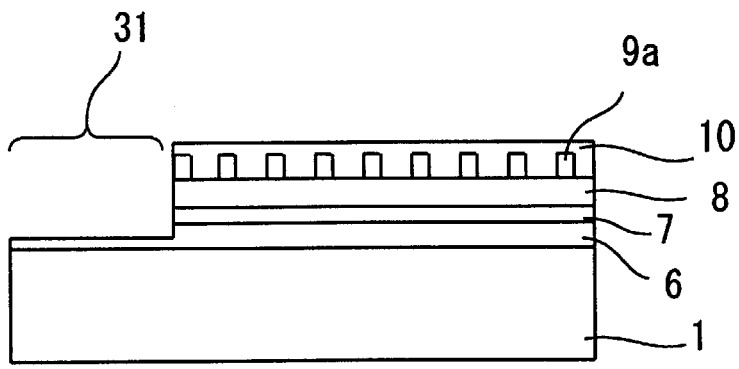

Then, as shown in FIG. 3D, parts of the p-InP second clad layer 10, the p-InGaAsP diffraction grating layer 9, the p-InP first clad layer 8, the InGaAsP multiple quantum well active layer 7 and the n-InP clad layer 6 on a part of the n-InP substrate 1 for the light modulator 31 are removed by etching.

Figure 4A:
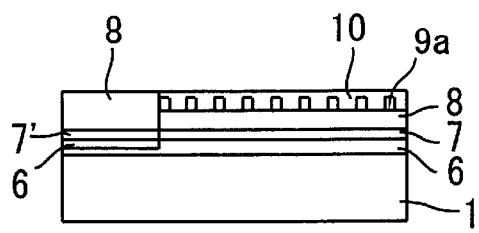
FIGS. 4A, 4B, 4C and 4D are typical sectional views of assistance in explaining the steps following the step of the method of manufacturing the light modulator-semiconductor laser device described with reference to FIG. 3D.

Then, as shown in FIG. 4A, the n-InP clad layer 6, the InGaAsP multiple quantum well active layer 7 and the p-InP first clad layer 8 are deposited sequentially by MOCVD processes or the like on the part for the light modulator 31 of the n-InP substrate 1.

In each of FIGS. 4B to 6B, both a longitudinal sectional view in a plane including the optical axis 32, a view on the left, and a cross-sectional view taken on line perpendicular to the optical axis 32, a view on the right, are shown.

Figure 4B:
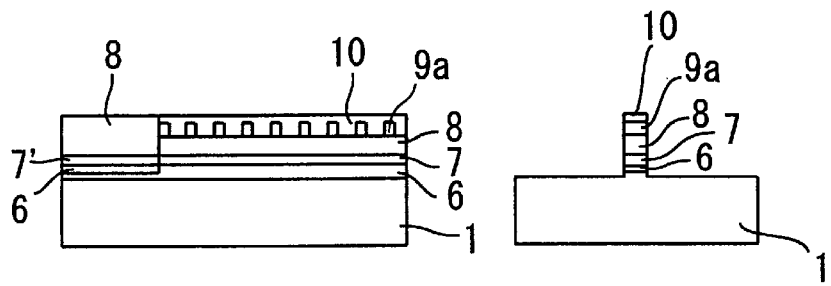

Then, as shown in FIG. 4B, the p-InP second clad layer 10, the p-InGaAsP diffraction grating layer 9, the p-InP first clad layer 8, the InGaAsP multiple quantum well active layer 7, the InGaAsP multiple quantum well absorbing layer 7' and the n-InP clad layer 6 are subjected to selective etching to form ridges of those layers extending in parallel to the optical axis 32.

Figure 4C:
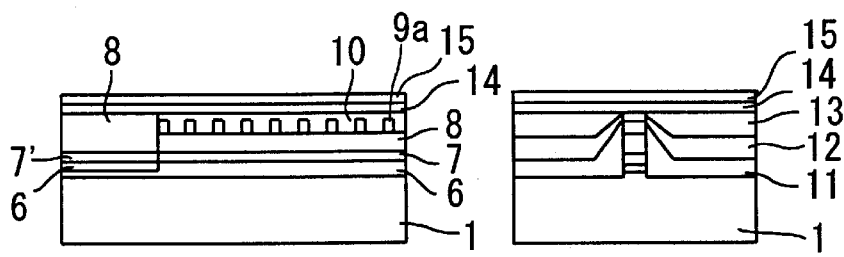

Then, as shown in FIG. 4C, the p-InP first buried layer 11, the n-InP second buried layer 12 and the p-InP third buried layer 13 are deposited on the opposite sides of the ridges of the n-InP clad layer 6, the InGaAsP multiple quantum well active layer 7, the p-InP first clad layer 8, diffraction grating 9a and the p-InP second clad layer 10 left in ridges, and then the p-InP third clad layer 14 and the p-InGaAsP contact layer 15 are deposited sequentially on the p-InP second clad layer 10 and the p-InP third buried layer 13.

Figure 4D:
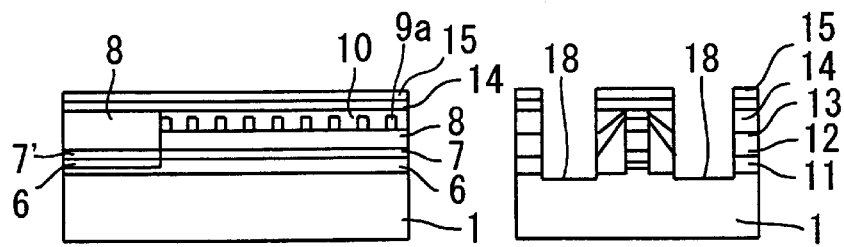

Then, as shown in FIG. 4D, openings 18 reaching the surface of the n-InP substrate 1 are formed by etching using hydrochloric acid (HCl). The screen electrode 17 is connected through the openings 18 to the n-InP substrate 1.

Figure 5A:
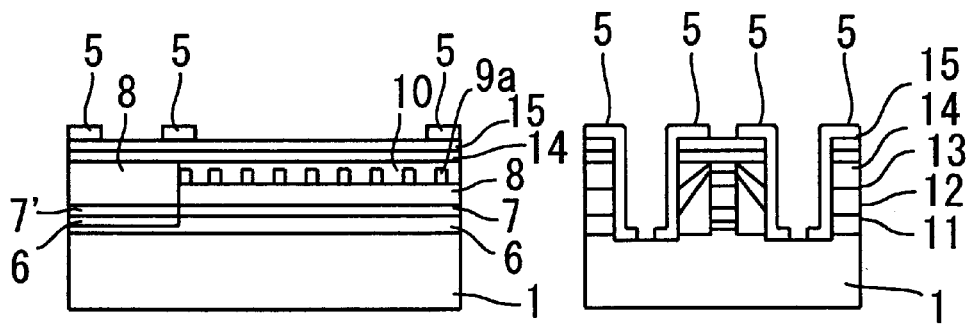
FIGS. 5A, 5B and 5C are typical sectional views of assistance in explaining the steps following the step of the method of manufacturing the light modulator-semiconductor laser device described with reference to FIG. 4D.

Then, as shown in FIG. 5A, the insulating film 5 of silicon dioxide ($SiO_2$) or silicon nitride (SiN) is formed by a sputtering process or a plasma CVD process. Subsequently, portions of the insulating film 5 on the p-InGaAsP contact layer 15 and the n-InP substrate 1 are removed selectively by photolithography and dry etching.

Figure 5B:
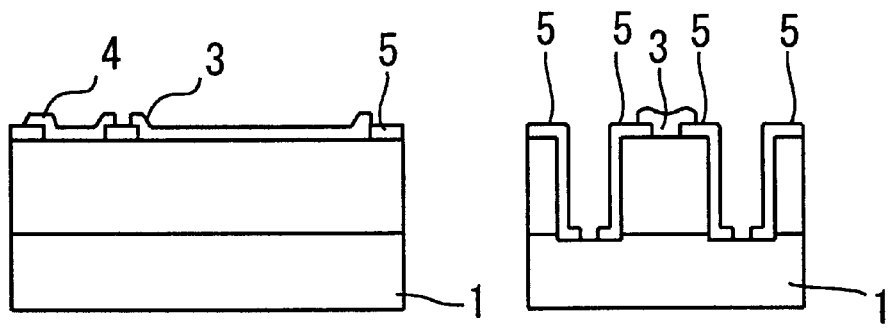

Then, as shown in FIG. 5B, the anodes 3 and 4 are formed in desired patterns by a vapor deposition process and a plating process in regions for the semiconductor laser unit 30 and the light modulator unit 31, respectively. The films sandwiched between the n-InP substrate 1 and the insulating film 5 are not shown in FIG. 5B and the following drawings.

Figure 5C:
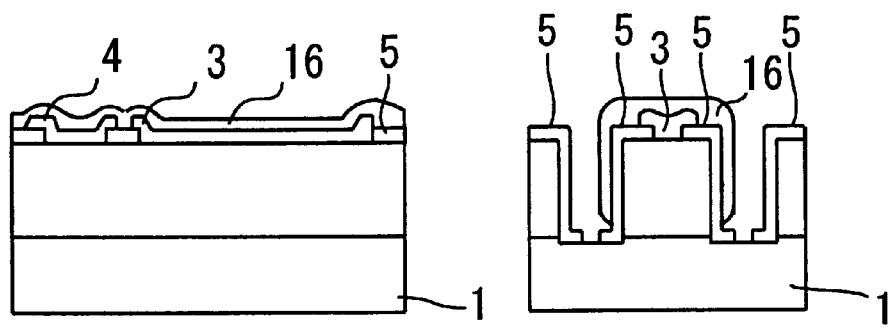

Then, as shown in FIG. 5C, a pattern of the insulating film 16 of silicon dioxide ($SiO_2$) or silicon nitride (SiN) is formed on the anode 3 by a sputtering process or a plasma CVD process.

Figure 6A:
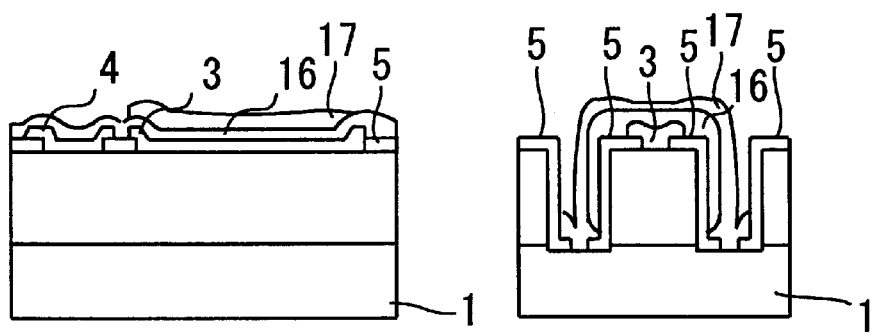
FIGS. 6A and 6B are typical sectional views of assistance in explaining the steps following the step of the method of manufacturing the light modulator-semiconductor laser device described with reference to FIG. 5C.

Then, as shown in FIG. 6A, a pattern of the screen electrode 17 is formed on the insulating film 16 by a vapor deposition process and a plating process so as to cover a substantially entire region corresponding to the anode 3.

Figure 6B:
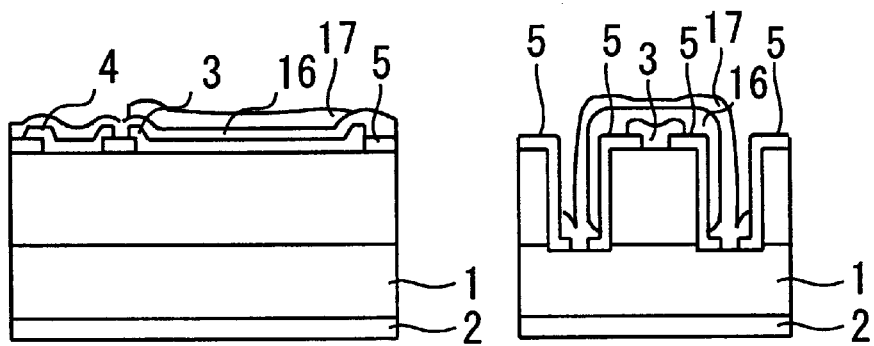

Then, as shown in FIG. 6B, the back surface of the n-InP substrate 1 is ground in a depth on the order of 100 $\mu$m and a pattern of the cathode 2 is formed on the ground back surface of the n-InP substrate 1 by a vapor deposition process and a plating process.

Subsequently, the wafer is divided into chips by dicing. An antireflection film is formed on the light-emitting end surface, i.e., the front end surface, of the chip, and a highly reflective film is formed on the back end surface of the chip to complete the light modulator-semiconductor laser device.

According to the first embodiment described above, the screen electrode 17 for intercepting electromagnetic waves is formed over the anode 3 and the screen electrode 17 is connected to the n-InP substrate 1 to set the same at a ground potential. Thus, the anode 3 is screened and the flow of high-frequency leakage current through the anode 3 and the cathode 2 can be prevented when a high-frequency voltage is applied to the light modulator unit 31.

Thus the variation of carrier density in the InGaAsP multiple quantum well active layer 7 with time attributable to the leakage current and the resultant variation of the refractive index of the InGaAsP multiple quantum well active layer 7 can be prevented. Consequently, the wavelength of the light incident on the light modulator unit 31 can be stabilized, the variation of the wavelength of the light modulated by the high-frequency wave can be suppressed, and the light transmission characteristic of the light modulator-semiconductor laser device can be improved.

A p-type substrate or a semiconductor-insulating substrate may be used instead of the n-InP substrate 1. The substrate may be formed of a semiconductor material other than InP, such as GaAs.

Second Embodiment

Figure 7:
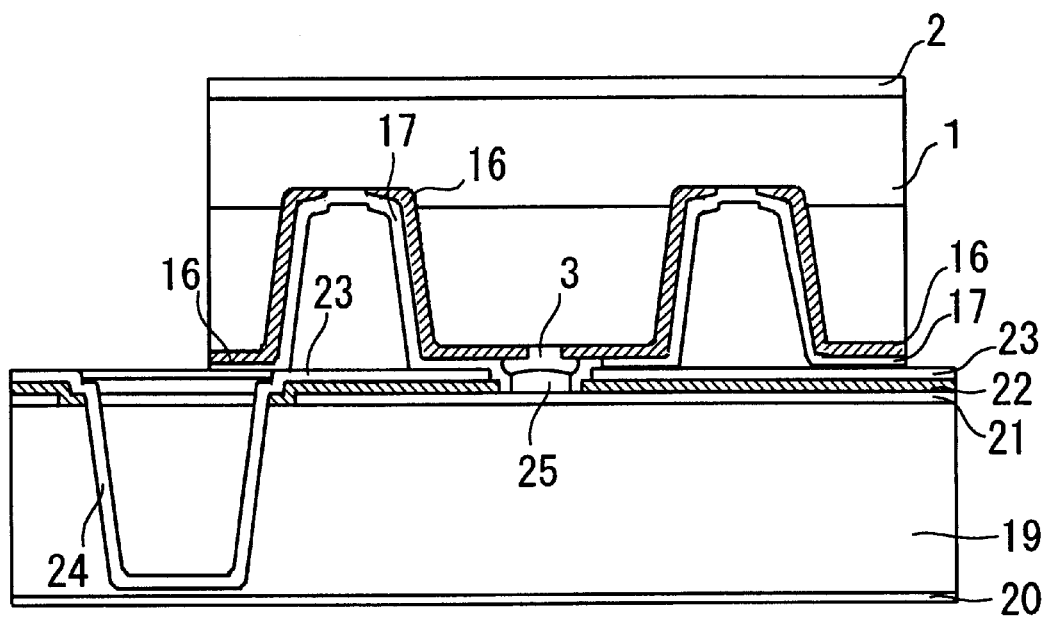
FIG. 7 is a typical sectional view of a light modulator-semiconductor laser device in a second embodiment according to the present invention.

FIG. 7 shows a semiconductor device in a second embodiment according to the present invention in a typical sectional view, in which parts like or corresponding to those of the light modulator-semiconductor laser device in the first embodiment are denoted by the same reference characters. The semiconductor device in the second embodiment is formed by bonding the light modulator-semiconductor laser device in the first embodiment to a substrate 19, i.e., a submount, by die bonding with its surface coated with the screen electrode 17 facing the substrate 19. The substrate 19 is provided with two electrodes (conductive layers) 21 and 23, i.e., power feed lines, isolated from each other by an insulating film 22.

The semiconductor device in the second embodiment will be described with reference to FIG. 7 showing the joint of the light modulator-semiconductor laser device and the substrate 19, i.e., a submount, in a typical sectional view. The light modulator-semiconductor laser device shown in FIG. 2 is inverted and the anode 3 and the screen electrode 17 are electrically connected to the substrate 19.

Shown in FIG. 7 are the n-InP substrate 1, the cathode 2, the anode 3 of the semiconductor laser unit 30, the insulating film 5, the screen electrode 17, the substrate 19 of alumina or aluminum nitride, a ground electrode 20 of Ti/Au formed on the back surface of the substrate 19, the Ti/Au electrode 21 formed on the surface of the substrate 19 to supply a current to the anode 3, the insulating film 22 of SiO$_2$ or SiN formed on the Ti/Au electrode 21, and the screen electrode 23 of Ti/Au formed on the insulating film 22 so as to cover the Ti/Au electrode 21 substantially entirely. A part of the screen electrode 23 corresponding to the joint of the anode 3 and the Ti/Au electrode 21 is removed. The screen electrode 23 is connected through a contact hole 24 to the ground electrode 20.

The anode 3 is connected to the Ti/Au electrode 21 by a bump 25 of Au or Au/Sn. The anode 3 of the semiconductor laser unit 30 is electrically and mechanically connected to the Ti/Au electrode 21 by the bump 25.

Since the Ti/Au electrode 21 of the substrate 19 is screened by the ground electrode 20 formed on the back surface of the substrate 19 and the screen electrode 23, electromagnetic waves generated by a high-frequency voltage applied to the light modulator unit 31 and propagating through space are unable to reach the Ti/Au electrode 21. Thus, the induction of an unnecessary high-frequency current in the anode 3 of the semiconductor laser unit 30 can be prevented. Therefore, the wavelength of light emitted by the semiconductor laser unit 30 can be stabilized and the light transmission characteristic of the light modulator-semiconductor laser device can be improved when the light modulator-semiconductor laser device is connected to the substrate 19. The substrate 19 connected to the light modulator-semiconductor laser device enhances the heat dissipation of the light modulatot-semiconductor laser device.

Third Embodiment

Figure 8:
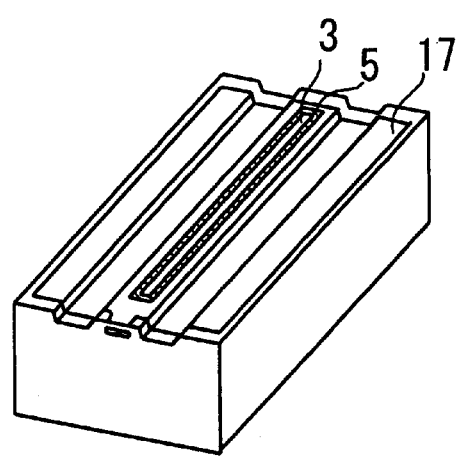
FIG. 8 is a perspective view of a light modulator-semiconductor laser device in a third embodiment according to the present invention.
Figure 9:
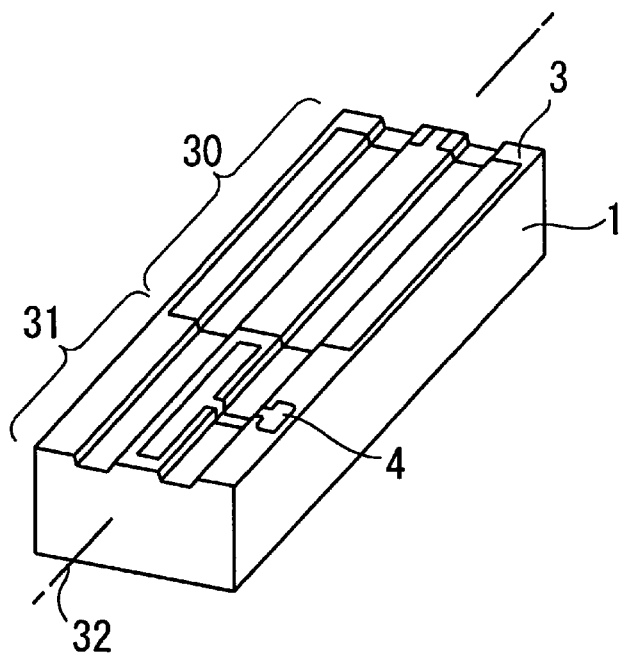
FIG. 9 is a perspective view of a conventional light modulator-semiconductor laser device.
Figure 10:
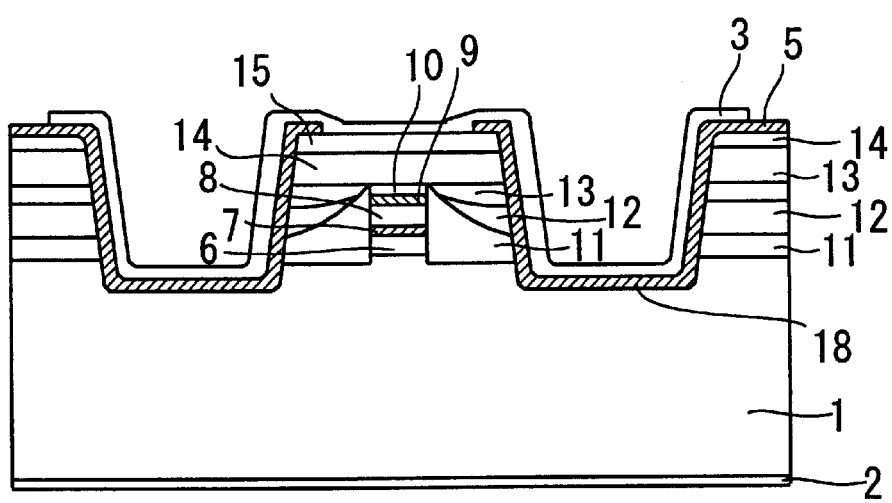
FIG. 10 is a typical sectional view of the conventional light modulator-semiconductor laser device shown in FIG. 9.

FIG. 8 is a perspective view of a semiconductor device in a third embodiment according to the present invention. The electrode configuration of the semiconductor laser unit 30 of the first embodiment is applicable to a semiconductor laser not provided with any unit like the light modulator unit 31. The semiconductor device shown in FIG. 8 is a semiconductor laser not provided with any unit like the light modulator unit 31 and having the electrode configuration of the first embodiment. The semiconductor device shown in FIG. 8 is similar in configuration to the semiconductor laser unit 30 of the light modulator-semiconductor laser device in the first embodiment. In FIG. 8, parts like or corresponding to those of the first embodiment are denoted by the same reference characters.

Shown in FIG. 8 are an anode 3, an insulating film of SiO$_2$ or SiN, a screen electrode 17 and an n-InP substrate 1. The screen electrode 17 is connected to the n-InP substrate 1 and serves also as a cathode. The semiconductor device has a sectional construction similar to that of the first embodiment shown in FIG. 2.

The semiconductor device in the third embodiment uses the anode 3 and the screen electrode 17 serving also as a cathode to supply a current to an InGaAsP multiple quantum well active layer 7 and hence any current does not flow through the n-InP substrate 1, so that the power consumption of the semiconductor device is very small. Suppose that the n-InP substrate 1 has a thickness of 100 $\mu$m and a resistance of 0.5 ohm, and a current of 1 A is supplied to the semiconductor device. Then, the power consumption of the semiconductor device can be reduced by about 0.5 W. Since the amount of heat generated by the semiconductor device and the temperature of the semiconductor device are reduced, the output capacity of the semiconductor device can be easily increased.

As apparent from the foregoing description, the semiconductor device in the third embodiment is a semiconductor laser having an electrode configuration analogous with that of the first embodiment and the screen electrode 17 is used also as a cathode. Thus, semiconductor device in the third embodiment, i.e., the semiconductor laser, has a high output capacity and is capable operating at a low power consumption.

Fourth Embodiment

A semiconductor device in a fourth embodiment according to the present invention is formed by mounting the semiconductor laser in the third embodiment on a substrate 19, i.e., submount, similar to that employed in the second embodiment. The sectional construction of the semiconductor device in the fourth embodiment is the same as that of the second embodiment shown in FIG. 7.

When the semiconductor device is bonded to the substrate 19, heat generated by the active layer of the semiconductor laser can be efficiently transferred to the substrate 19. Thus, the configuration of the fourth embodiment is effective in improving the heat-dissipating characteristic of a semiconductor laser that generates heat at a high rate and provided with a substrate having a low heat conductivity to enhance the optical output capacity.

According to the present invention, since the second electrode is formed on the insulating film covering the first electrode and the second electrode is grounded, the first electrode to which a predetermined voltage is applied can be screened and hence, even if electromagnetic waves propagate through space, the flow of leakage current between both the semiconductor layers due to the effect of the electromagnetic waves can be prevented.

Since the second electrode is electrically connected to the other semiconductor layer, supply of any current to the semiconductor substrate underlying both the semiconductor layers is not necessary when the first electrode is used as an anode and the second electrode is used as a cathode and, consequently, power consumption can be greatly reduced.

The application of the structure of the first electrode and the second electrode for screening formed over the first electrode to the light modulator-semiconductor laser device, in which the light-absorbing layer and the active layer are disposed adjacently to each other, prevents the flow of high-frequency leakage current between the semiconductor layers due to the application of the high-frequency voltage to the light modulator unit.

The present invention employing an n-type semiconductor layer as the other semiconductor layer, and using the first electrode as an anode is applicable to a semiconductor device, such as a semiconductor laser having a pn-junction formed on an n-type semiconductor substrate.

The present invention employing a p-type semiconductor layer as the other semiconductor layer, and using the first electrode as a cathode is applicable to a semiconductor device, such as a semiconductor laser having a pn-junction formed on a p-type semiconductor substrate.

The first electrode can be screened by the second conductive layer formed on the substrate as a submount and the flow of leakage current between the semiconductor layers due to the influence of external electromagnetic waves can be surely prevented by electrically connecting the first electrode to the first conductive layer formed on the substrate as a submount. When the semiconductor device is connected to the substrate as a submount, heat generated by the active layer can be efficiently transferred to the substrate as a submount and heat dissipating efficiency can be improved.

Since the first electrode and the first conductive layer are connected to each other by the bump, the reliable electrical and mechanical connection of the semiconductor device and the substrate as a submount can be achieved.

Since the third conductive layer formed on the back surface of the insulating substrate is electrically connected to the second conductive layer, the first conductive layer for applying a predetermined voltage to the first electrode can be sandwiched between the grounded second and the third conductive layer and the first conductive layer can be surely concealed.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-136113, filed on May 7, 2001 including specification, claims, drawings and summary, on which the Convention priority of the present application is based, are incorporated herein by reference in its entirety.

What is claimed is:

1. A semiconductor device including:

an active layer;

a first semiconductor layer on a first side of said active layer;

a second semiconductor layer on a second side of said active layer, opposite the first side, said active layer emitting light when a voltage is applied across said first and second semiconductor layers;

a first electrode on said first semiconductor layer;

an insulating film covering at least part of said first electrode; and a second electrode on said insulating film, insulated from said first electrode by a part of said insulating film, and grounded, parts of said first and second electrodes sandwiching the part of said insulating film.

2. The semiconductor device according to claim 1, wherein said second semiconductor layer and said second electrode are electrically connected to each other.

3. The semiconductor device according to claim 1, further comprising a light modulator unit including a light-absorbing layer modulating light emitted by said active layer, wherein said light-absorbing layer is adjacent said active layer.

4. The semiconductor device according to claim 1, wherein said second semiconductor layer is a n-type semiconductor layer, and said first electrode is an anode.

5. The semiconductor device according to claim 1, wherein said second semiconductor layer is a p-type semiconductor layer, and said second electrode is a cathode.

6. The semiconductor device comprising:

an active layer;

a first semiconductor layer on a first side of said active layer;

a second semiconductor layer on a second side of said active layer, opposite the first side, said active layer emitting light when a voltage is applied across said first and second semiconductor layers;

a first electrode on said first semiconductor layer;

an insulating film covering at least part of said first electrode;

a second electrode on said insulating film and grounded;

a substrate, to which said first electrode is connected electrically, said substrate including an insulating substrate;

a first conductive layer on a front surface of said insulating substrate;

an insulating layer on said first conductive layer; and a second conductive layer on said insulating layer, wherein said first electrode is connected electrically to said first conductive layer, and said second conductive layer is grounded.

7. The semiconductor device according to claim 6, wherein said second conductive layer is absent where said first electrode and said substrate coincide with each other, and including a bump connecting said first electrode to said first conductive layer.

8. The semiconductor device according to claim 6, further comprising a third conductive layer on a back surface of said insulating substrate, wherein said second conductive layer is connected electrically to said third conductive layer.

* * * * *